(12) United States Patent
Chen et al.

(10) Patent No.: US 12,424,502 B2
(45) Date of Patent: Sep. 23, 2025

(54) INTEGRATED CIRCUIT PACKAGE WITH HEAT TRANSFER CHIMNEY INCLUDING THERMALLY CONDUCTIVE NANOPARTICLES

(71) Applicant: Microchip Technology Incorporated, Chandler, AZ (US)

(72) Inventors: Bomy Chen, Newark, CA (US); Justin Sato, West Linn, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 528 days.

(21) Appl. No.: 17/889,760

(22) Filed: Aug. 17, 2022

(65) Prior Publication Data

US 2023/0055102 A1 Feb. 23, 2023

Related U.S. Application Data

(60) Provisional application No. 63/234,604, filed on Aug. 18, 2021.

(51) Int. Cl.
| | |
|---|---|
| *H01L 23/31* | (2006.01) |
| *H01L 21/56* | (2006.01) |
| *H01L 23/29* | (2006.01) |
| *H01L 23/552* | (2006.01) |
| *H01L 25/00* | (2006.01) |

(Continued)

(52) U.S. Cl.
CPC .......... *H01L 23/3135* (2013.01); *H01L 21/56* (2013.01); *H01L 23/295* (2013.01); *H01L 23/552* (2013.01); *H01L 25/0655* (2013.01); *H01L 25/0657* (2013.01); *H01L 25/50* (2013.01); *H01L 23/3121* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48105* (2013.01); *H01L 2224/48175* (2013.01);

(Continued)

(58) Field of Classification Search
CPC .............................. H01L 23/36; H10H 20/852
See application file for complete search history.

(56) References Cited

U.S. PATENT DOCUMENTS

| | | | |
|---|---|---|---|
| 2005/0045358 A1 | 3/2005 | Arnold | 174/51 |
| 2012/0045871 A1 | 2/2012 | Lee et al. | 438/127 |

(Continued)

FOREIGN PATENT DOCUMENTS

KR 20210046480 A1 4/2021 ............. H10L 23/29

OTHER PUBLICATIONS

International Search Report and Written Opinion, Application No. PCT/US2022/040769, 19 pages, Mar. 6, 2023.

(Continued)

*Primary Examiner* — Yu-Hsi D Sun
(74) *Attorney, Agent, or Firm* — SLAYDEN GRUBERT BEARD PLLC

(57) ABSTRACT

An electronic device includes an integrated circuit package including a die mounted on a die carrier, a mold structure at least partially encapsulating the mounted die, and a heat transfer chimney formed on the die. The heat transfer chimney extends at least partially through the mold structure to transfer heat away from the die. The heat transfer chimney is formed from a thermally conductive compound including thermally conductive nanoparticles.

23 Claims, 10 Drawing Sheets

(51) Int. Cl.
*H01L 25/065* (2023.01)
*H01L 23/00* (2006.01)

(52) U.S. Cl.
CPC ............... *H01L 2224/48225* (2013.01); *H01L 2224/73204* (2013.01); *H01L 2225/06589* (2013.01)

(56) References Cited

U.S. PATENT DOCUMENTS

2018/0151467 A1* 5/2018 Venugopal .......... H01L 23/5226
2021/0193620 A1 6/2021 Refai-ahmed et al.

OTHER PUBLICATIONS

Partial International Search Report and Invitation to Pay Additional Fees, Application No. PCT/US2022/040769, 15 pages, Dec. 8, 2022.

Huang, Jiangnan et al., "Magnetic Epoxy Nanocomposites with Superparamagnetic MnFe2O4 Nanoparticles," AIP Advances 5, 097183, URL: https://aip.scitation.org/doi/pdf/10.1063/1.4932381, 15 pages, Sep. 30, 2015.

Fishman Corporation, "SmartDispenser® General Fluids Benchtop Automation," URL: https://www.fishmancorp.com/smartdispenser/benchtop-automation/smartdispenser-b/, 5 pages, Printed on Aug. 26, 2022.

Mimaki Global, "JFX200-2513 EX," URL: https://mimaki.com/product/inkjet/i-flat/jfx200-2513-ex/feature.html, 10 pages, Printed on Aug. 26, 2022.

Carima, "New Top-down Industrial DLP 3D Printer, DM400A," URL: https://carima.com/?q=YToxOntzOjEyOiJrZX13b3JkX3R5cGUiO3M6MzoiYWxsIjt9&bmode=view &idx=5601384&t=board, 3 pages, Printed on Aug. 26, 2022.

* cited by examiner

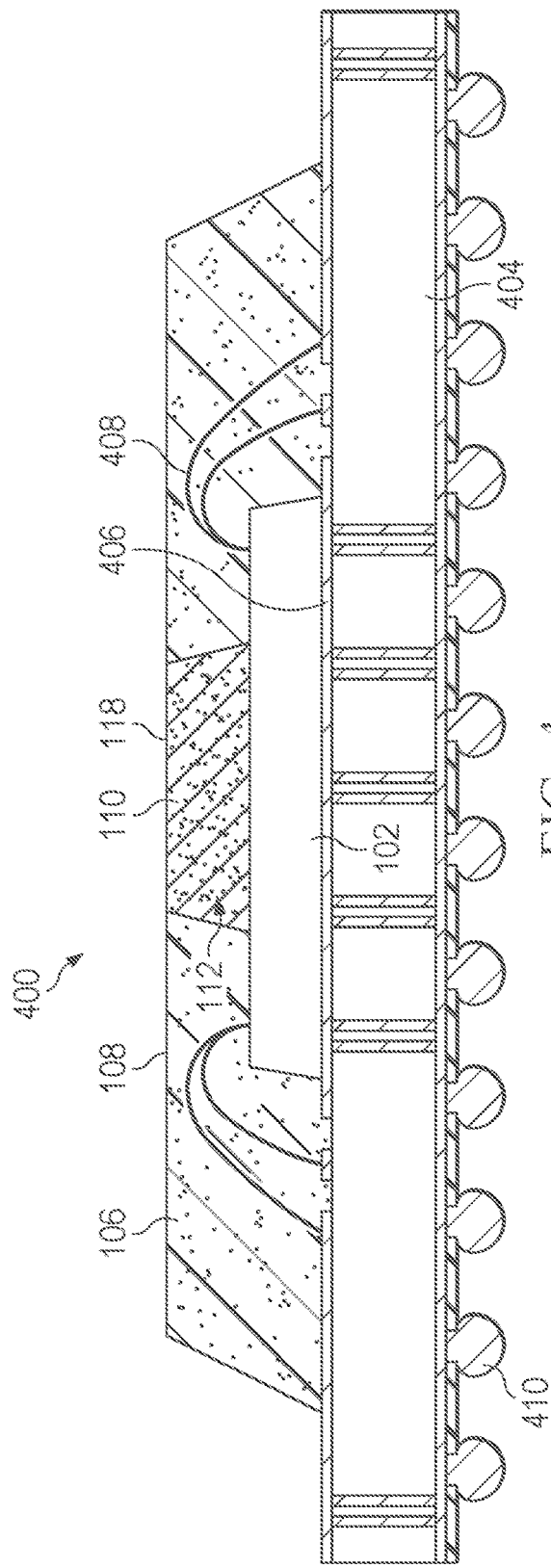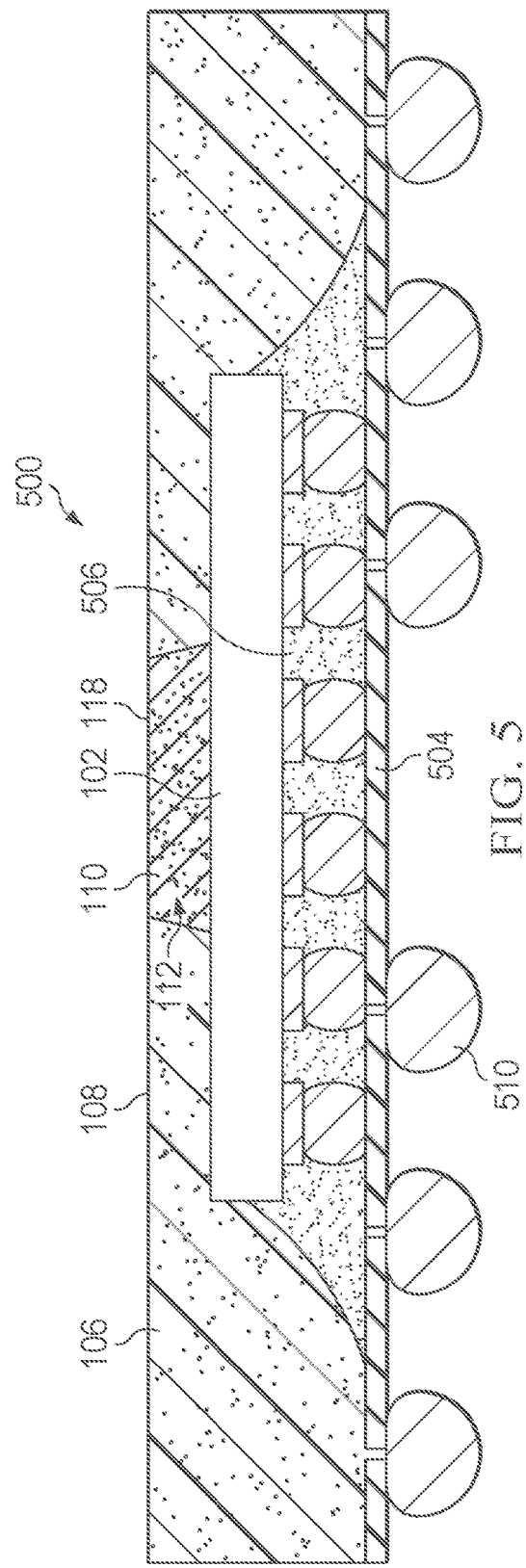

INTEGRATED CIRCUIT PACKAGE WITH HEAT TRANSFER CHIMNEY INCLUDING THERMALLY CONDUCTIVE NANOPARTICLES

RELATED PATENT APPLICATION

This application claims priority to commonly owned U.S. Provisional Patent Application No. 63/234,604 filed Aug. 18, 2021, the entire contents of which are hereby incorporated by reference for all purposes.

TECHNICAL FIELD

The present disclosure relates to integrated circuit (IC) devices, and more particularly to IC packages with a heat transfer chimney including thermally conductive nanoparticles.

BACKGROUND

As integrated circuit devices (semiconductor devices) become smaller and more densely populated, device performance is becoming increasingly limited by thermal constraints. In addition, integrated circuit devices are often susceptible to magnetic fields and ionizing radiation that negatively affect device performance.

There is a need for improved thermal management in IC devices, e.g., to remove heat from heat-generating dies. There is also a need for improved shielding of IC devices from magnetic fields and ionizing radiation, which can damage or affect the performance of IC devices.

SUMMARY

One aspect provides an electronic device including an integrated circuit (IC) package including a die mounted on a die carrier, a mold structure at least partially encapsulating the mounted die, and a heat transfer chimney formed on the die and extending at least partially through the mold structure to transfer heat away from the die. The heat transfer chimney is formed from a thermally conductive compound including thermally conductive nanoparticles.

In some examples, the heat transfer chimney extends through a full thickness of the mold structure, wherein a distal surface of the heat transfer chimney is exposed through an outer surface of the mold structure.

In some examples, the die carrier comprises a lead frame or an interposer.

In some examples, the thermally conductive nanoparticles comprise at least one of diamond nanoparticles, silicon carbide nanoparticles, boron nitride nanoparticles, hexagonal boron nitride nanoparticles, or boron nitride nanotubes.

In some examples, the thermally conductive compound including thermally conductive nanoparticles dispersed in a polymer resin.

In some examples, the thermally conductive compound includes thermally conductive nanoparticles and silica dispersed in an epoxy resin.

In some examples, the mold structure includes magnetic shielding nanoparticles to shield the die from magnetic fields.

In some examples, the magnetic shielding nanoparticles comprise at least one of mu-metal or hematite ($Fe_2O_3$).

In some examples, the mold structure includes radiation shielding nanoparticles to shield the die from ionic radiation.

In some examples, the shielding nanoparticles comprise at least one of boron nitride (BN), bismuth (Bi), bismuth oxide ($Bi_2O_3$), tantalum nitride (TaN), tungsten nitride ($W_3N_2$), tin oxide ($SnO_2$), copper (I) oxide ($Cu_2O$) (i.e., cuprous oxide), or copper(II) oxide (CuO) (i.e., cupric oxide).

In some examples, the electronic device includes a shielding layer formed over the mold structure, the shielding layer including at least one of (a) magnetic shielding nanoparticles to shield the die from magnetic fields or (b) radiation shielding nanoparticles to shield the die from ionizing radiation.

In some examples, the electronic device includes a multi-layer shield formed over the mold structure, wherein the multi-layer shield includes multiple different shielding layers, wherein respective shielding layers of the multiple different shielding layers include shielding nanoparticles to shield the die from at least one of magnetic fields or ionizing radiation, wherein the multiple different shielding layers include different types or different concentrations of shielding nanoparticles.

In some examples, the different types or different concentrations of shielding nanoparticles in the multiple different shielding layers of the multi-layer shield defines a shielding gradient.

In some examples, the integrated circuit package is mounted on a first side of a package support structure, and the electronic device includes a back-side shielding layer formed on a second side of the package support structure opposite the first side, the back-side shielding layer including shielding nanoparticles to shield the die from at least one of magnetic fields or ionizing radiation.

In some examples, the package support structure comprises a printed circuit board or an interposer.

One aspect provides a method including forming an integrated circuit package, including mounting a die on a die carrier, forming a heat transfer chimney on the die, and forming a mold structure at least partially encapsulating the die, wherein the heat transfer chimney extends at least partially through the mold structure, and wherein the heat transfer chimney includes thermally conductive nanoparticles to transfer heat away from the die.

In some examples, the method includes forming a thermally conductive compound, including mixing (a) silica particles and (b) thermally conductive nanoparticles with a polymer, and forming the heat transfer chimney from the thermally conductive compound.

In some examples, the method includes forming a thermally conductive compound, including (a) mixing a surfactant with the thermally conductive nanoparticles to form surfactant-coated thermally conductive nanoparticles, and (b) mixing the surfactant-coated thermally conductive nanoparticles with a polymer, and forming the heat transfer chimney from the thermally conductive compound.

In some examples, the method includes forming a thermally conductive compound, including (a) mixing a surfactant with the thermally conductive nanoparticles to form surfactant-coated thermally conductive nanoparticles, and (b) mixing (i) the surfactant-coated thermally conductive nanoparticles and (ii) silica filler with an epoxy, and forming the heat transfer chimney from the thermally conductive compound.

In some examples, forming the thermally conductive compound includes mixing silica particles and thermally conductive nanoparticles with an epoxy resin, wherein the thermally conductive nanoparticles comprise diamond nanoparticles, silicon carbide nanoparticles, boron nitride nanoparticles, hexagonal boron nitride nanoparticles, or boron nitride nanotubes In some examples, forming the heat transfer chimney on the die comprises printing the heat transfer chimney using an additive printing process.

In some examples, the method includes mixing shielding nanoparticles with a mold compound to form a nanoparticle-enhanced mold compound, and forming the mold structure from the nanoparticle-enhanced mold compound.

In some examples, the method includes forming a shielding layer over the mold structure, the shielding layer including at least one of (a) magnetic shielding nanoparticles to shield the die from magnetic fields or (b) radiation shielding nanoparticles to shield the die from ionizing radiation.

In some examples, the method includes forming multiple different shielding layers over the mold structure, wherein respective shielding layers of the multiple different shielding layers include shielding nanoparticles to shield the die from at least one of magnetic fields or ionizing radiation, wherein the multiple different shielding layers include different types or different concentrations of shielding nanoparticles.

One aspect provides a method including forming a first integrated circuit package including mounting a first integrated circuit die, and forming a mold structure at least partially encapsulating the first integrated circuit die, and performing a thermal analysis of the first integrated circuit package. The method further includes forming a second integrated circuit package, including determining a first chimney location based on the thermal analysis of the first integrated circuit package, and forming a first heat transfer chimney on a second integrated circuit die at the determined first chimney location.

In some examples, the method further includes performing a thermal analysis of the second integrated circuit package, and forming a third integrated circuit package, including determining a second chimney location, different than the first chimney location, based on the thermal analysis of the second integrated circuit package, and forming a second heat transfer chimney on a third integrated circuit die at the determined second chimney location.

BRIEF DESCRIPTION OF THE DRAWINGS

Example aspects of the present disclosure are described below in conjunction with the figures, in which:

FIG. 4 is a cross-sectional side view of an example ball grid array (BGA) package. The example BGA package including a heat transfer chimney including thermally conductive nanoparticles;

FIG. 5 is a cross-sectional side view of an example flip-chip plastic ball grid array (FC-PBGA) package including a heat transfer chimney including thermally conductive nanoparticles;

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides an IC package including a heat transfer chimney formed from a thermally conductive compound including thermally conductive nanoparticles, for example diamond nanoparticles, silicon carbide (SiC) nanoparticles, boron nitride (BN) nanoparticles, hexagonal boron nitride (h-BN) nanoparticles, or boron nitride nanotubes (BNNT), to improve thermal management of the respective IC packages. In some examples the heat transfer chimney may be formed by an additive printing process, e.g., a 2D, 2.5D, or 3D printing process. The heat transfer chimney including thermally conductive nanoparticles may improve heat transfer from a die, which may lower an operating temperature of the die, decrease dark silicon, increase battery life, or otherwise improve performance of the respective IC package.

Some examples also include shielding nanoparticles, e.g., for shielding a die (or multiple dies) from magnetic fields and/or ionizing radiation, provided in a mold encapsulation formed over the die(s) and/or provided in additional shielding layers formed over the mold encapsulation. For example, IC devices incorporating radiation shielding nanoparticles may be provided for Low Earth Orbit (LEO) applications that require or benefit from improved radiation shielding. As another example, magnetically susceptible products (for example magneto-resistive random-access memory (MRAM) or a chip scale atomic clock may benefit from a high permeability magnetic shield.

Figure 1:
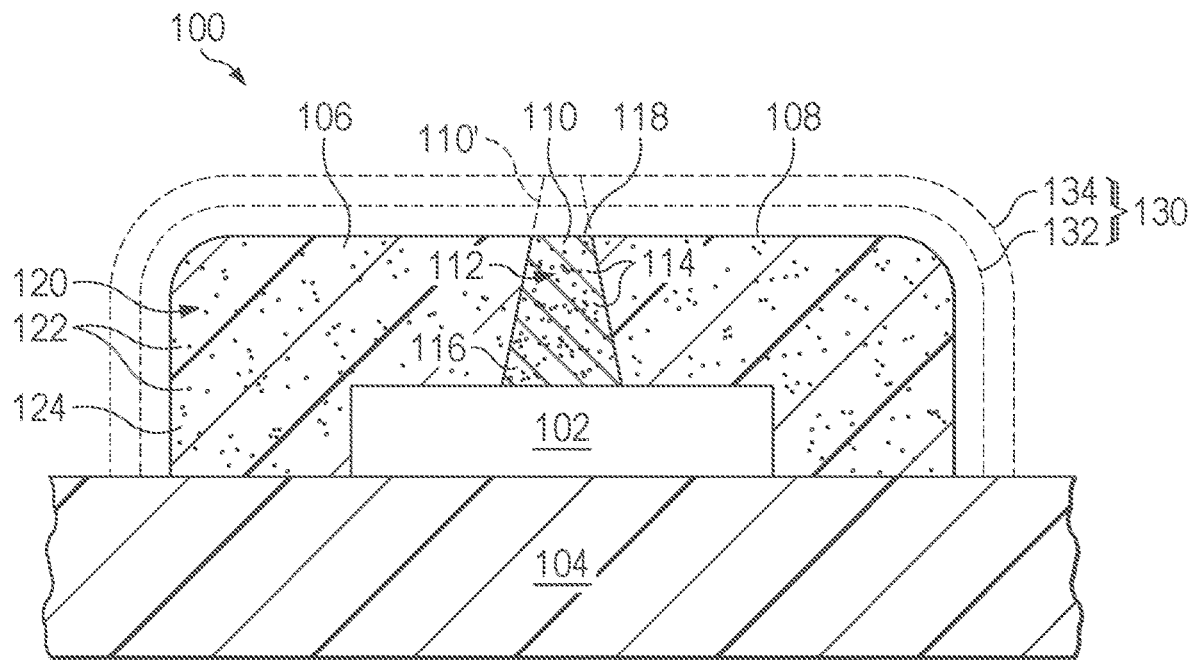
FIG. 1 is a cross-sectional side view showing an example integrated circuit package including a heat transfer chimney including thermally conductive nanoparticles.

FIG. 1 is a cross-sectional side view showing an example integrated circuit package 100 including a die 102 mounted on a die carrier 104, a heat transfer chimney 110 formed on the die 102, and a mold structure 106 (e.g., a mold encapsulation) at least partially encapsulating the mounted die 102. The heat transfer chimney 110 may extend at least partially through the mold structure 106 to transfer heat away from the die 102. The heat transfer chimney 110 may be formed from a thermally conductive compound 112 including thermally conductive nanoparticles 114. In some examples the heat transfer chimney 110 extends through a full thickness of the mold structure 106, such that a distal surface 118 of the heat transfer chimney 110 is exposed through an outer surface 108 of the mold structure 106.

The die 102 may comprise any type of die, chip (e.g., silicon substrate having an integrated circuit formed thereon), or other integrated circuit device (e.g., including analog devices, digital devices, or a mixture of analog and digital devices) that generates or outputs heat. For example, the die 102 may comprise a microprocessor (e.g., a central processing unit (CPU) chip), a microcontroller (MCU), an application specific IC (ASIC), a graphics processing unit (GPU), a digital signal processor (DSP), an A/D converters or D/A converter, or memory (e.g., Flash memory, random access memory (RAM), read only memory (ROM), e.g., electrically erasable programmable read-only memory (EEPROM), or other memory), or a system-on-chip (SoC) device.

The die carrier 104 may comprise any structure on which the die 102 may be mounted, for example a printed circuit board (PCB), a lead frame, an interposer, a heat sink, or another die. The die 102 may be mounted on the die carrier 104 in any suitable manner, for example solder mounting, adhesive bonding (e.g., using an epoxy), flip-chip bonding, or eutectic bonding.

As indicated above, the heat transfer chimney 110 formed on the die 102 may be formed from a thermally conductive compound 112 including thermally conductive nanoparticles 114, and functions to transfer heat away from the die 102.

In some examples the thermally conductive compound 112 includes thermally conductive nanoparticles 114 dispersed in a polymer base, for example an epoxy resin. In some examples the thermally conductive compound 112 includes thermally conductive nanoparticles 114 dispersed in or otherwise combined with a base compound 116, for example a polymer resin. In some examples the thermally conductive compound 112 also includes silica ($SiO_2$) filler (e.g., in the form of fumed silica or colloidal silica) to thicken or otherwise enhance the structural integrity of the base compound (e.g., epoxy) 116. Thus, the thermally conductive compound 112 may include thermally conductive nanoparticles 114 and silica ($SiO_2$) filler dispersed in or otherwise combined with an epoxy resin. As used herein, a "compound" may refer to one element or substance, or a mixture or other combination of multiple elements or substances. The term nanoparticles, as used herein, refers to a particle having a maximum dimension between 1 and 100 nanometers.

In some examples the thermally conductive nanoparticles 114 comprise at least one of diamond nanoparticles, silicon carbide (SiC) nanoparticles, boron nitride (BN) nanoparticles, hexagonal boron nitride (h-BN) nanoparticles, or boron nitride nanotubes (BNNT). In some examples, the thermally conductive compound 112 includes a mixture of thermally conductive nanoparticles 114 and a base compound 116 comprising an epoxy resin or a mixture of epoxy resin and silica ($SiO_2$).

The heat transfer chimney 110 may be formed on the die 102 in any suitable manner. In some examples the heat transfer chimney 110 may be printed on the die 102 using an additive printing process, for example a 2D, 2.5D, or 3D printing process. In such examples, the horizontal lines shown in the heat transfer chimney 110 (in all figures) may represent printed layers of the thermally conductive compound 112. In other examples, the heat transfer chimney 110 may be formed by injection molding using a nozzle (e.g., using a microliter/minute flow rate), or spin-coating. In some examples the heat transfer chimney 110 may be formed on the die 102 at a selected location or area of the die 102, for example a heat-generating area of the die 102 (e.g., as determined based on a thermal analysis, as discussed below with reference to FIG. 10).

In some examples, the mold structure 106 may also include performance-enhancing nanoparticles. For example, the mold structure 106 may comprise a nanoparticle-enhanced mold compound 120 including shielding nanoparticles 122 dispersed in or otherwise combined with a base mold compound 124. The base mold compound 124 may comprise, for example, an elastomer (e.g., silicone, polyurethane, chloroprene, butyl, polybutadiene, neoprene, natural rubber or isoprene), a thermoset (e.g., thermoset resin), or other molding compound, which may be supplied in the form of pellets, liquids, or powders, for example. In some examples the shielding nanoparticles 122 may include nanoparticles to shield the die 102 from magnetic fields and/or ionizing radiation. For example, the shielding nanoparticles 122 may include magnetic shielding nanoparticles to shield the die from magnetic fields. Magnetic shielding nanoparticles may include mu-metal or hematite ($Fe_2O_3$) nanoparticles, for example. As another example, the shielding nanoparticles 122 may include radiation shielding nanoparticles to shield the die from ionizing radiation. Radiation shielding nanoparticles may include, for example, boron nitride (BN), bismuth (Bi), bismuth oxide ($Bi_2O_3$), tantalum nitride (TaN), tungsten nitride ($W_3N_2$), tin oxide ($SnO_2$), copper (I) oxide ($Cu_2O$) (i.e., cuprous oxide), or copper (II) oxide (CuO) (i.e., cupric oxide) nanoparticles.

In some examples, the example integrated circuit package 100 may optionally include at least one shielding layer 130 formed over the mold structure 106. The illustrated example shows two example shielding layers 132 and 134 formed over the mold structure 106, with shielding layer 134 formed over shielding layer 132. Other examples include a single shielding layer 130, or more than two shielding layers 130 (e.g., three, four, or more shielding layers 130). Other examples omit shielding layers 130. Respective shielding layer(s) 130 may include shielding nanoparticles dispersed in or otherwise combined with a base. For example, respective shielding layer(s) 130 may include magnetic shielding nanoparticles and/or radiation shielding nanoparticles, e.g., as discussed above regarding mold structure 106.

In examples with multiple shielding layers 130, different shielding layers 130 may include different types or different concentrations of shielding nanoparticles. For example, referring to the example shown in FIG. 1, shielding layer 132 may comprise magnetic shielding nanoparticles (e.g., to shield die 102 from magnetic fields) and shielding layer 134 may comprise radiation shielding nanoparticles (e.g., to shield die 102 from ionic radiation). As another example, shielding layers 132 and 134 may comprise the same type of nanoparticles (e.g., magnetic shielding nanoparticles or radiation shielding nanoparticles) but with a respective different concentration of nanoparticles, to thereby define a shielding gradient along a direction toward or away from the die 102. For example, the shielding layers 132 and 134 may provide an increasing degree of shielding in a direction toward the die 102 (e.g., wherein the shielding layer 132, which may be termed inner shielding layer 132, may provide a greater degree of shielding than shielding layer 134, which may be termed outer shielding layer 134).

In examples including at least one shielding layer 130, the heat transfer chimney 110 may extend through the shielding layer(s) 130, as indicated by 110' in FIG. 1. In other examples, the shielding layer(s) 130 may cover the distal surface 118 of the heat transfer chimney 110.

FIGS. 2A-2F show an example process for forming the example integrated circuit package 100 shown in FIG. 1.

Figure 2A:
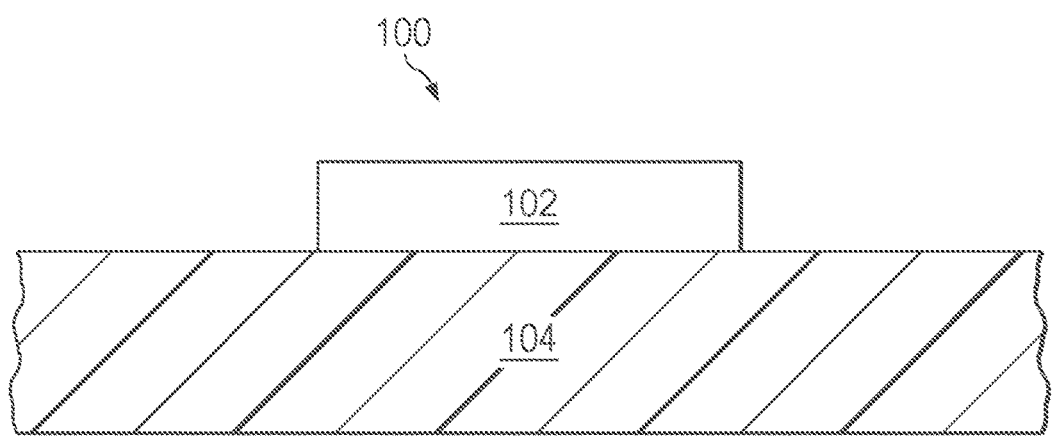
FIGS. 2A-2F show an example process for forming the example integrated circuit package shown in FIG. 1.

FIG. 2A is a cross-sectional side view showing a die 102 mounted on die carrier 104 using any suitable mounting technique, for example solder mounting, adhesive bonding (e.g., using an epoxy), flip-chip bonding, or eutectic bonding.

Figure 2B:
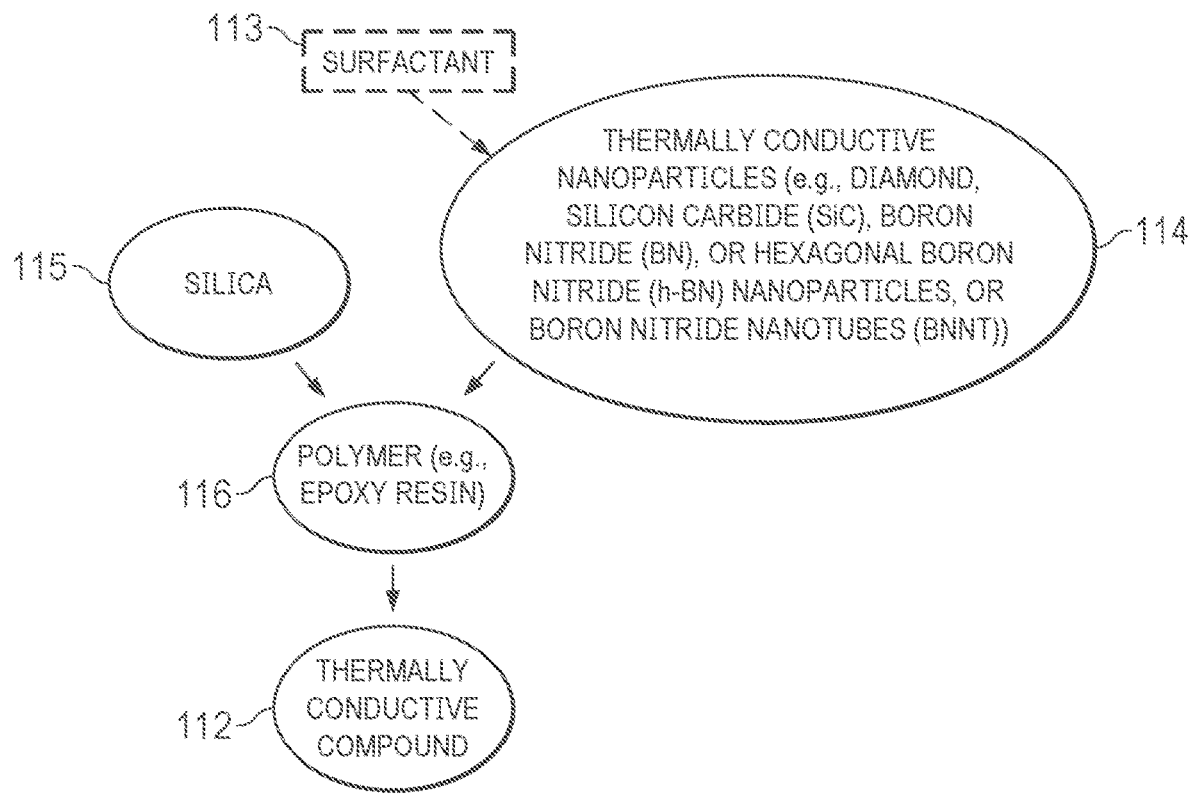

As shown in FIG. 2B, the thermally conductive compound 112 is formed. In this example, (a) thermally conductive nanoparticles 114 (e.g., comprising diamond nanoparticles, silicon carbide (SiC) nanoparticles, boron nitride (BN) nanoparticles, hexagonal boron nitride (h-BN) nanoparticles, or boron nitride nanotubes (BNNT)) and (b) (optional) silica ($SiO_2$) filler 115 (e.g., in the form of fumed silica or colloidal silica) are mixed or otherwise combined with (c) a base compound 116 (e.g., comprising an epoxy resin or other polymer) to produce the thermally conductive compound 112. The thermally conductive nanoparticles 114, (optional) silica filler 115, and base compound 116 may be mixed or combined in any suitable manner, for example using an agitation and/or ultrasonic vibration process.

In some examples a surfactant 113 may (optionally) be added to enhance or expedite the dissolving of the thermally conductive nanoparticles 114 in the base compound (e.g., epoxy) 116. For example, the thermally conductive nanoparticles 114 may be mixed with a surfactant that forms a coating on the respective thermally conductive nanoparticles 114 (e.g., after waiting several hours), and the resulting surfactant-coated nanoparticles 114 and silica filler 115 may be mixed (e.g., by an agitation or ultrasonic vibration process) with an epoxy base 116. In some examples, the surfactant 113 may include one or more long-chain amphiphilic compounds including both hydrophobic and hydrophilic groups, wherein such compound(s) may be classified according based on a subtype of the hydrophilic group, e.g., cationic, anionic, zwitterionic, or nonionic surfactants.

In some examples, the thermally conductive nanoparticles 114 (with or without surfactant coating) and silica filler 115 may be added to the base compound 116 (e.g., epoxy resin) in a single step. For example, the thermally conductive nanoparticles 114 may first be mixed with silica filler 115, and then dispersed in an epoxy resin. In other examples, silica filler 115 may first be added to the base compound 116 (e.g., epoxy resin) to form a base compound/silica mixture, and the thermally conductive nanoparticles 114 may then be dispersed in the base compound/silica mixture.

The thermally conductive nanoparticles 114 and the (optional) silica filler 115 may comprise any suitable portion, e.g., as defined by volume fraction, of the resulting thermally conductive compound 112. In some examples using an epoxy as the base compound 116, the thermally conductive nanoparticles 114 and the (optional) silica filler 115 may collectively define up to 85% by volume fraction of the resulting thermally conductive compound 112, which may provide a sufficient amount of epoxy (e.g., at least 15% by volume fraction) for structural integrity of a heat transfer chimney 110 formed from the thermally conductive compound 112. In some examples, the thermally conductive nanoparticles 114 may comprise 5-85% by volume fraction of the thermally conductive compound 112. In certain examples, the thermally conductive nanoparticles 114 may comprise 50-75% by volume fraction of the thermally conductive compound 112.

Figure 2C:
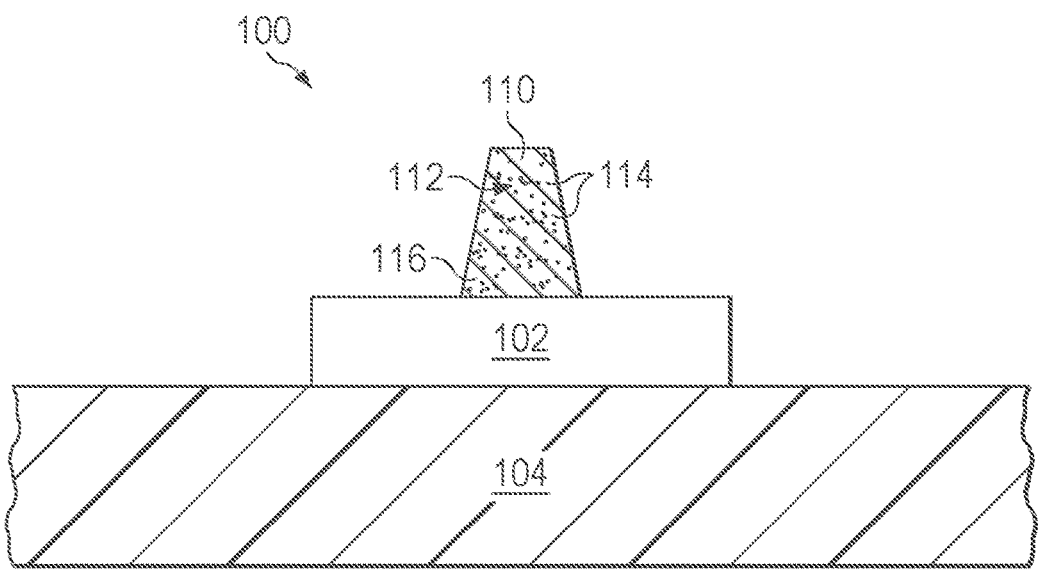

As shown in FIG. 2C, the heat transfer chimney 110 is formed on the die 102 from the thermally conductive compound 112. In some examples the heat transfer chimney 110 is printed on the die 102 using an additive printing process, for example a 2D, 2.5D, or 3D printer. For example, the heat transfer chimney 110 may be printed in a single layer or multiple layers (e.g., 2-20 layers). In some examples the heat transfer chimney 110 may be formed by depositing a single droplet or a small number of droplets using a 2D printer, e.g., a 2D nozzle-based inkjet printer. In some examples, the 2.5D or 3D printer may include, for example, a resin dispense printer, a 2D inkjet printer or other 2D fluid dispense printer (e.g., configured to deposit droplets through a single nozzle or pattern of nozzles), a 2.5D fluid dispense printer (e.g., SmartDispenser® General Fluids Benchtop Automation with AirFree® Technology by Fishman Corporation of Hopkinton, MA), or a 3D top-down printer (e.g., DM400A DLP 3D printer by Carima, of Seoul, Korea).

In other examples, the heat transfer chimney 110 may be formed on the die 102 using an injection molding process, e.g., using an injection molding nozzle to deposit a single droplet or a few droplets of the thermally conductive compound 112.

In some examples the heat transfer chimney 110 may be formed on the die 102 at a selected location or area of the die 102, for example a heat-generating area of the die 102. In some examples a thermal analysis may be performed to identify a location on the die 102 to form the heat transfer chimney 110. As discussed below with reference to FIG. 10, such thermal analysis may include an iterative process of forming and analyzing heat transfer chimneys at different locations on respective test devices to determine a target location for the heat transfer chimney 110.

Figure 2D:
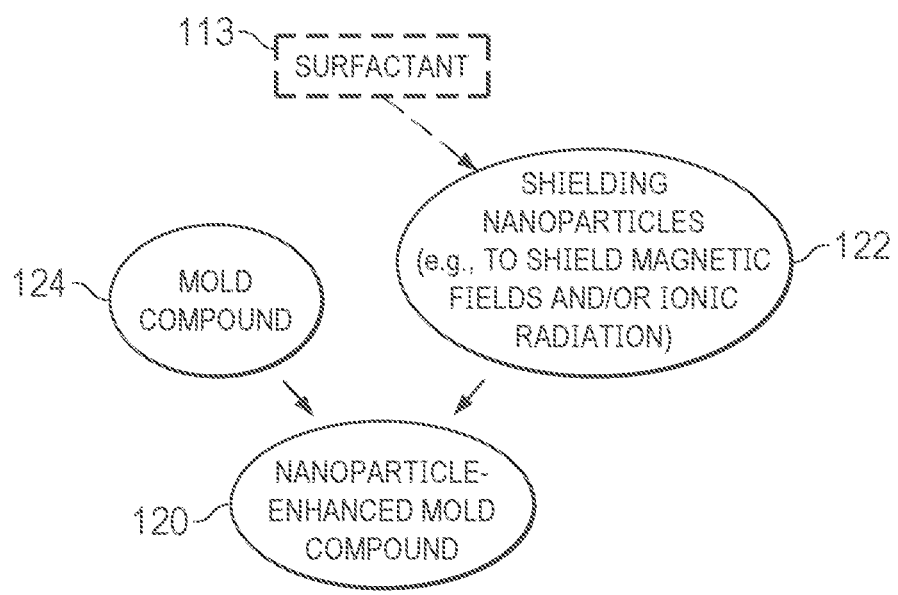

As shown in FIG. 2D, the nanoparticle-enhanced mold compound 120 is formed. In this example, shielding nanoparticles 122 are dispersed in or otherwise combined with a base mold compound 124 to produce the nanoparticle-enhanced mold compound 120. In some examples a surfactant 113 may (optionally) be added to enhance or expedite the dissolving of the shielding nanoparticles 122 in the base mold compound 124, e.g., as discussed above regarding the thermally conductive nanoparticles 114 dissolved in the base compound 116.

The shielding nanoparticles 122 (with or without surfactant coating) may be mixed or combined with the base mold compound 124 in any suitable manner, e.g., using an agitation or ultrasonic vibration process. As discussed above, in some examples the shielding nanoparticles 122 may include magnetic shielding nanoparticles to shield the die 102 from magnetic fields and/or radiation shielding nanoparticles to shield the die 102 from ionizing radiation. Example shielding nanoparticles 122 (including example magnetic shielding nanoparticles and example radiation shielding nanoparticles) and examples of base mold compound 124, are listed above with reference to FIG. 1.

Figure 2E:
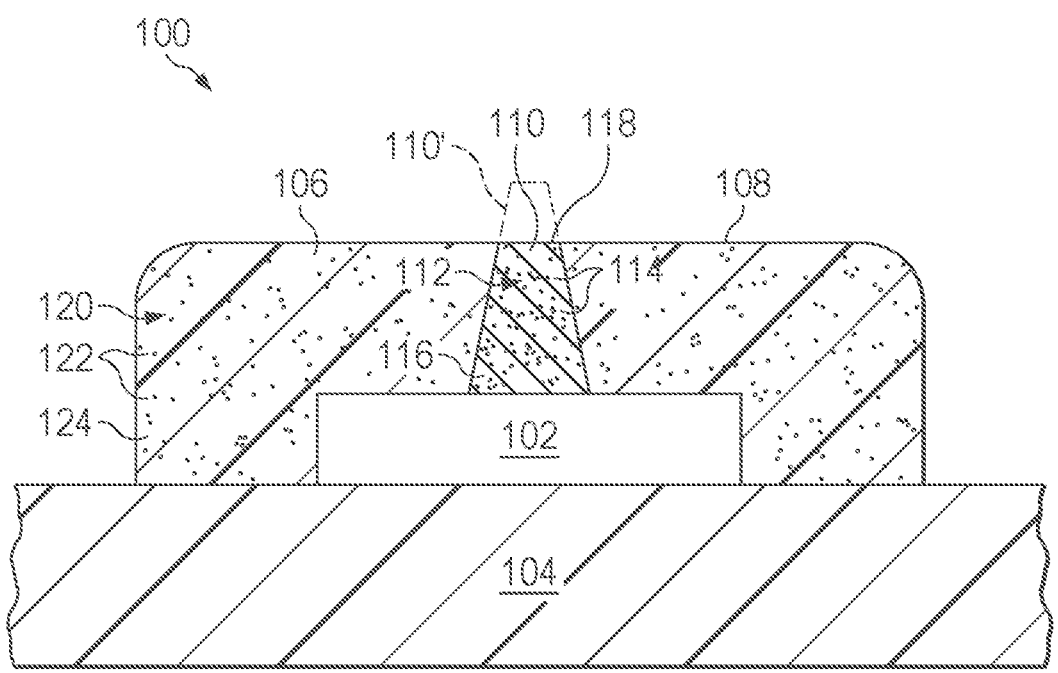

As shown in FIG. 2E, the mold structure 106 may be formed over the die 102 from the nanoparticle-enhanced mold compound 120. The mold structure 106 may be formed in any suitable manner, for example by injection molding, compression molding, reaction injection molding (RIM), resin transfer molding (RTM), or blow molding. In some examples the mold structure 106 may encapsulate exposed surfaces of the die 102, e.g., so that the die 102 is fully encapsulated by the support structure 104, mold structure 106, heat transfer chimney 110, and/or other structures formed on or adjacent the die 102. The heat transfer chimney 110 may extend through the formed mold structure 106, so that the distal surface 118 of heat transfer chimney 110 is exposed through the mold structure 106. For example, the distal surface 118 of heat transfer chimney 110 is flush with or projects above the adjacent top surface 108 of the mold structure 106, e.g., allowing a heat sink or other thermally conductive structure to be arranged in direct contact with the heat transfer chimney 110 for transferring heat away from die 102.

Figure 2F:
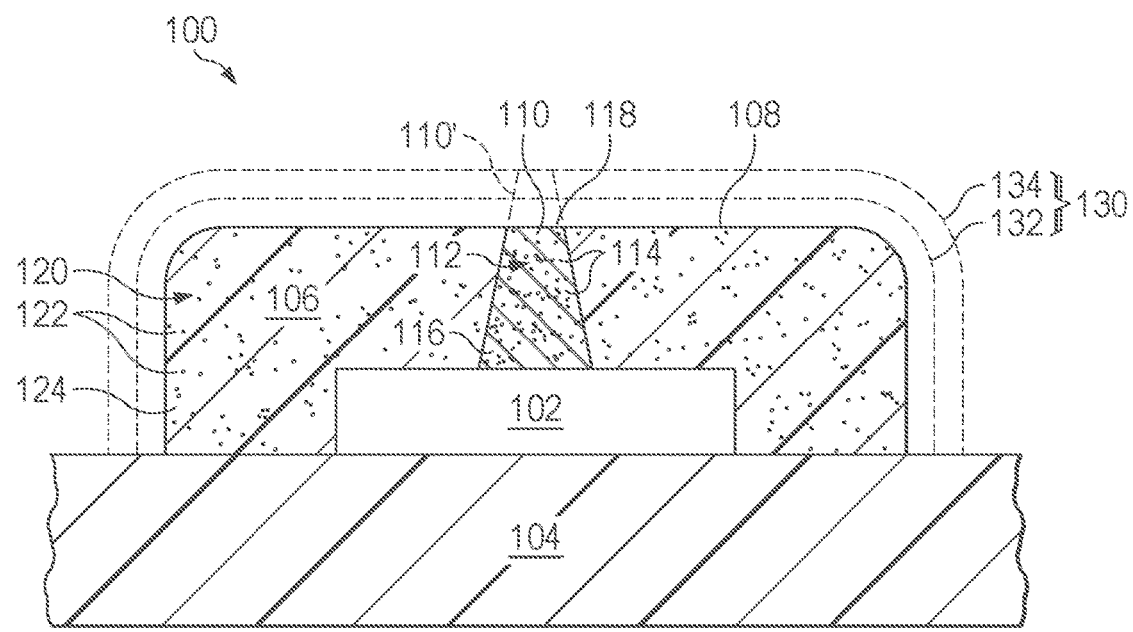

In examples in which optional shielding layer(s) 130 are subsequently formed over the mold structure 106 (e.g., as shown in FIG. 2F discussed below), the heat transfer chimney 110 and mold structure 106 may be formed such that heat transfer chimney 110 extends beyond (in the illustrated example, above) the top surface 108 of the mold structure 106 by a distance associated with a total thickness of the shielding layer(s) 130, as indicated by 110' in FIG. 2F. In such example the top surface 118 of the heat transfer chimney 110' may be flush with or protrude above a top surface of the outer shielding layer 130, as discussed below.

As shown in FIG. 2F, in some examples at least one shielding layer 130 may (optionally) be formed over the mold structure 106. The illustrated example shows example shielding layers 132 and 134 formed over the mold structure 106. As discussed above, respective shielding layers 132 and 134 may include shielding nanoparticles (e.g., magnetic shielding nanoparticles and/or radiation shielding nanoparticles) dispersed in or otherwise combined with a base compound, e.g., an epoxy or other polymer. Example magnetic shielding nanoparticles and example radiation shielding nanoparticles are listed above with reference to FIG. 1. As discussed above, other examples may include a single shielding layer 130, or more than two shielding layers 130, or may omit shielding layers 130.

In examples including at least one shielding layer 130, the heat transfer chimney 110 may extend through the shielding layer(s) 130, as indicated by 110' in FIG. 2F. In other examples, the shielding layer(s) 130 may cover distal surface 118 (see FIG. 2E) of the heat transfer chimney 110.

Figure 3:
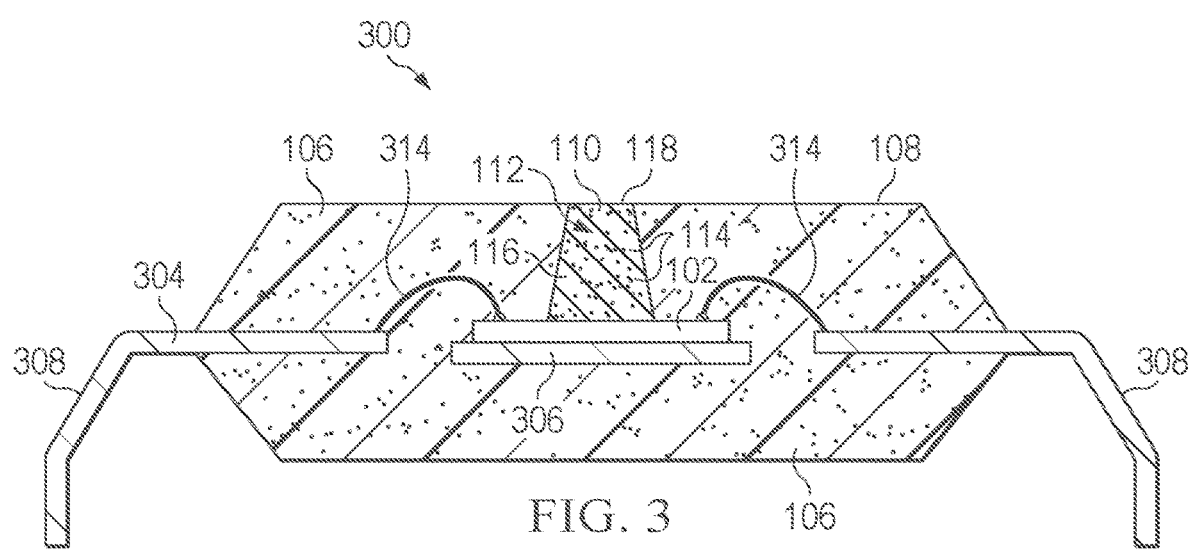
FIG. 3 is a cross-sectional side view of an example lead frame package including a heat transfer chimney including thermally conductive nanoparticles.

FIG. 3 is a cross-sectional side view showing an example IC package 300 formed as a lead frame package including a die 102 mounted on a lead frame 304. The lead frame 304 may include a die attach pad 306 on which the die 102 is mounted, and a plurality of lead fingers 308 arranged around a periphery of the die attach pad 306. The die 102 may be mounted on the die attach pad 306 in any suitable manner, e.g., using an epoxy or other adhesive. The die 102 may be electrically connected to selected lead fingers 308 by a number of wire bond wires 314 soldered or otherwise secured to the die 102 and to the respective lead fingers 308.

As shown, a heat transfer chimney 110 may be formed on the die 102 at a selected location or area of the die 102 using any suitable process, e.g., using an additive printing process (for example a 2D, 2.5D, or 3D printer) or other process disclosed herein. The heat transfer chimney 110 may be formed from a thermally conductive compound 112 including thermally conductive nanoparticles 114 dispersed in a base compound 116 (e.g., epoxy resin), e.g., as described above. The die 102 may be encapsulated by a mold structure 106, which may extend above and below the die 102 and die attach pad 306. As shown, the mold structure 106 may be formed such that the distal surface 118 of the heat transfer chimney 110 extends through the top surface 108 of the mold structure 106. In other examples the mold structure 106 may extend over the top of the heat transfer chimney 110 to thereby encapsulate the heat transfer chimney 110.

In some examples, the mold structure 106 may include shielding nanoparticles dispersed in or otherwise combined with a base mold compound, e.g., as discussed above regarding FIG. 1. For example, the shielding nanoparticles may include magnetic shielding nanoparticles to shield the die 102 from magnetic fields and/or radiation shielding nanoparticles to shield the die 102 from ionizing radiation. Example magnetic shielding nanoparticles and example radiation shielding nanoparticles are listed above.

FIG. 4 is a cross-sectional side view showing an example IC package 400 formed as a ball grid array (BGA) package. The example BGA package 400 includes a die 102 mounted on a substrate 404 (e.g., a B-T epoxy substrate). The die 102 may be mounted face-up on a die pad 406 formed on a top side of the substrate 404. The die 102 may be connected to circuitry formed on, or in, the substrate by respective wire bond wires 408. Solder balls 410 may be formed on a bottom side of the substrate 404 for mounting the IC package 400 to a PCB or other structure.

As shown, a heat transfer chimney 110 may be formed on the die 102 at a selected location or area of the die 102 using any suitable process, e.g., using an additive printing process (for example a 2D, 2.5D, or 3D printer) or other process disclosed herein. The heat transfer chimney 110 may be formed from a thermally conductive compound 112 including thermally conductive nanoparticles dispersed in a base compound (e.g., epoxy resin), e.g., as described above. The die 102 may be encapsulated by a mold structure 106 formed over the substrate 404. As shown, the mold structure 106 may be formed such that the distal surface 118 of the heat transfer chimney 110 extends through the top surface 108 of the mold structure 106. In other examples the mold structure 106 may extend over the top of the heat transfer chimney 110 to thereby encapsulate the heat transfer chimney 110.

In some examples, the mold structure 106 may include shielding nanoparticles dispersed in or otherwise combined with a base mold compound, e.g., as discussed above regarding FIG. 1. For example, the shielding nanoparticles may include magnetic shielding nanoparticles to shield the die 102 from magnetic fields and/or radiation shielding nanoparticles to shield the die 102 from ionizing radiation. Example magnetic shielding nanoparticles and example radiation shielding nanoparticles are listed above.

FIG. 5 is a cross-sectional side view showing an example IC package 500 formed as a flip-chip pBGA (FC-PBGA) package. The example flip-chip PBGA package 500 includes a die 102 flip-chip mounted on a substrate 504 by solder ball mounting with an epoxy underfill 506. Solder balls 510 may be formed on a bottom side of the substrate 504 for mounting the IC package 500 to a PCB or other structure.

As shown, a heat transfer chimney 110 may be formed on the (flip-chip mounted) die 102 at a selected location or area of the die 102 using any suitable process, e.g., using an additive printing process (for example a 2D, 2.5D, or 3D printer) or other process disclosed herein. The heat transfer chimney 110 may be formed from a thermally conductive compound 112 including thermally conductive nanoparticles dispersed in a base compound (e.g., epoxy resin), e.g., as described above. The die 102 may be encapsulated by a mold structure 106 formed over the substrate 504. As shown, the mold structure 106 may be formed such that the distal surface 118 of the heat transfer chimney 110 extends through the top surface 108 of the mold structure 106. In other examples the mold structure 106 may extend over the top of the heat transfer chimney 110 to thereby encapsulate the heat transfer chimney 110. In some examples, the mold structure 106 may include shielding nanoparticles, e.g., magnetic shielding nanoparticles and/or radiation shielding nanoparticles, as discussed above.

Figure 6:
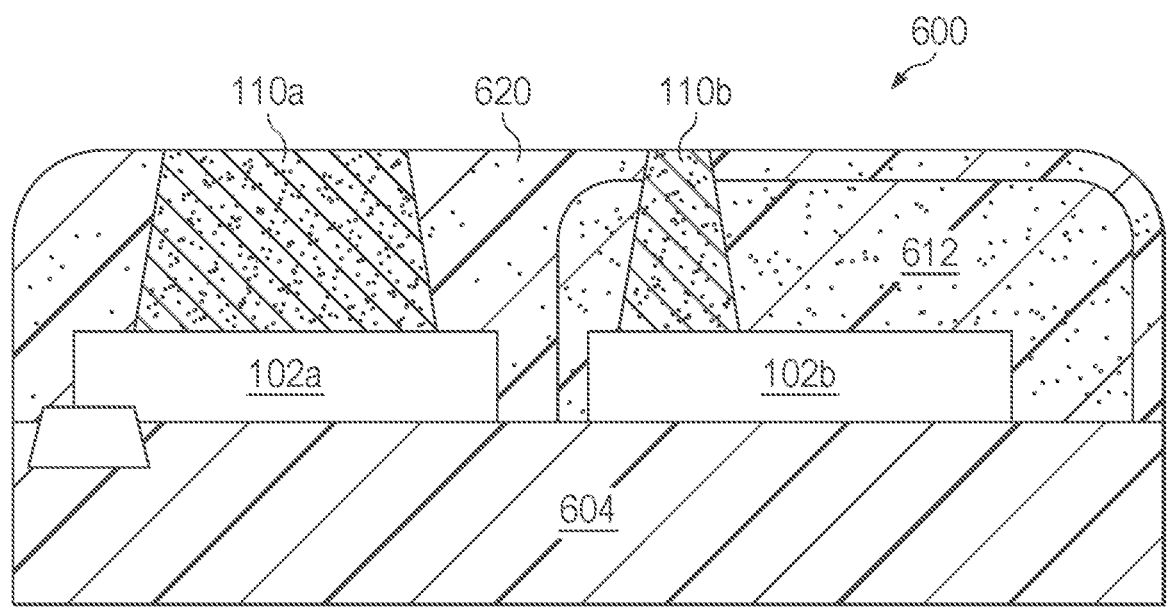
FIG. 6 is a cross-sectional side view of an example IC package including first and second dies and respective heat transfer chimneys formed on the respective first and second dies.

FIG. 6 is a cross-sectional side view showing an example IC package 600 including a first die 102a and a second die 102b, e.g., a field programmable gate array (FPGA) and a power management IC (PMIC), mounted on an interposer 604. A first heat transfer chimney 110a is formed on the first die 102a, and a second heat transfer chimney 110b is formed on the second die 102b. Heat transfer chimneys 110a and 110b may be respectively formed at identified heat-generating locations on the respective dies 102a and 102b, e.g., as determined based on thermal analysis of IC package 600 (or similar IC packages).

In the illustrated example, a radiation shielding layer (or encapsulation structure) 612 is formed over the second die 102b (e.g., PMIC die), but not over the FPGA die, to shield the second die 102b from ionizing radiation. The radiation shielding layer 612 may include radiation shielding nanoparticles, e.g., boron nitride (BN), bismuth (Bi), bismuth oxide ($Bi_2O_3$), tantalum nitride (TaN), tungsten nitride ($W_3N_2$), tin oxide ($SnO_2$), copper (I) oxide ($Cu_2O$), or copper (II) oxide (CuO) nanoparticles. A mold compound 620 is formed over both dies 102a and 102b, and over the radiation shielding layer 612 formed over the second die 102b. In some examples the mold compound 620 may include magnetic shielding nanoparticles, e.g., mu-metal or $Fe_2O_3$ nanoparticles, to shield both the first die 102a and the second die 102b from magnetic fields.

Figure 7:
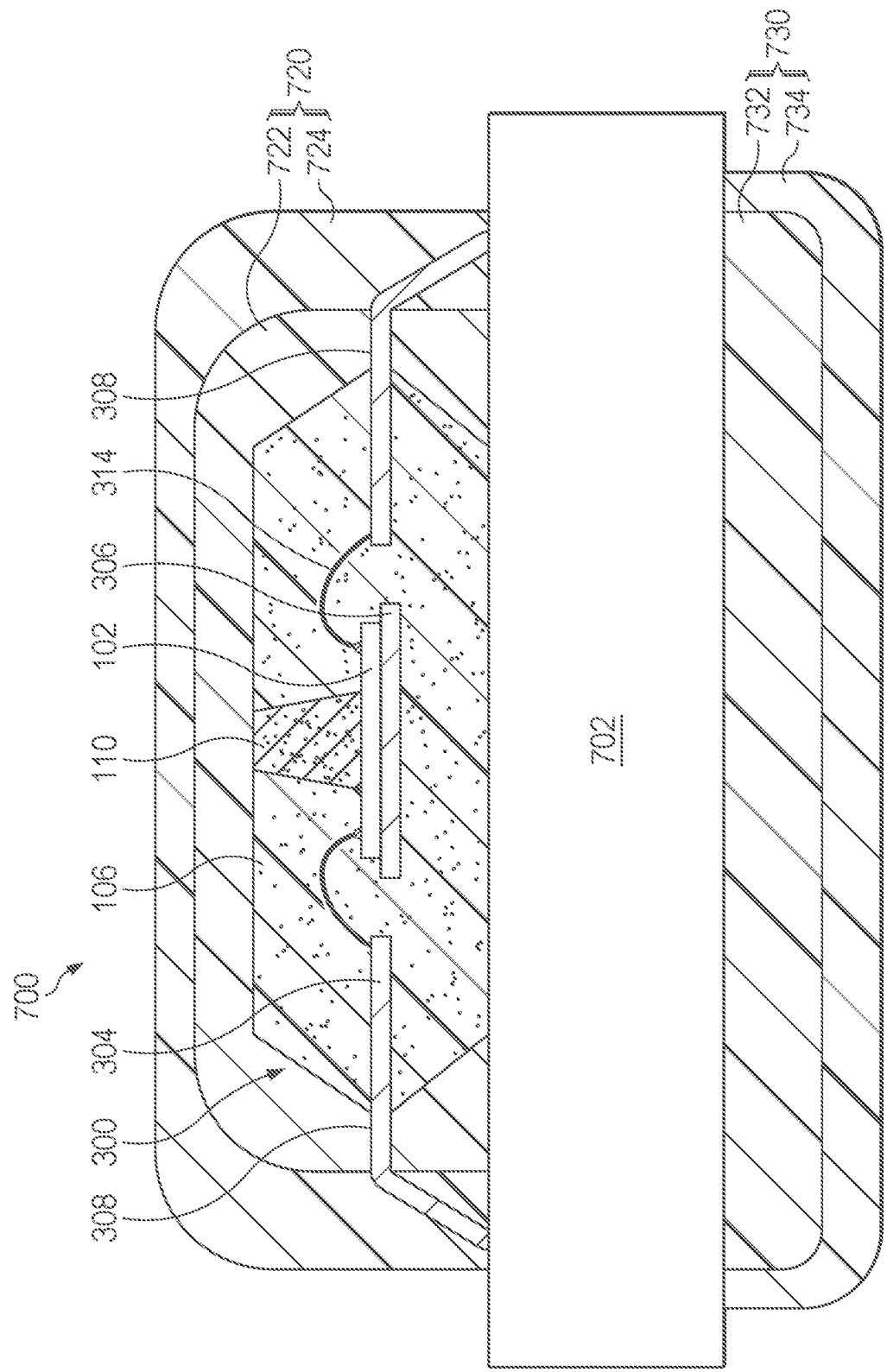
FIG. 7 is a cross-sectional side view of an example electronic device including the example lead frame package shown in FIG. 3 mounted on PCB, and including shielding layers formed on the top side and bottom side of the PCB.

FIG. 7 is a cross-sectional side view showing an example electronic device 700 including the example IC package 300 (lead frame package) shown in FIG. 3 mounted on a package support structure, e.g., a PCB 702. As discussed above with respect to FIG. 3, the example lead frame package 300 includes a lead frame 304 including a die attach pad 306 and a plurality of lead fingers 308, a die 102 mounted on the die attach pad 306 and connected to selected lead fingers 308 by respective wire bond wires 314, a heat transfer chimney 110 formed on the die 102, and a mold structure 106 extending above and below the die attach pad 306 and encapsulating the die 102. As discussed above, the heat transfer chimney 110 may be formed from a thermally conductive compound 112 including thermally conductive nanoparticles 114 dispersed in a base compound 116 (e.g., epoxy resin). In addition, the mold structure 106 may include shielding nanoparticles, for example magnetic shielding nanoparticles to shield the die 102 from magnetic fields and/or radiation shielding nanoparticles to shield the die 102 from ionizing radiation.

As shown in FIG. 7, the example electronic device 700 includes upper shielding layers 720 on a top side of the PCB 702 and lower shielding layers 730 on a back side of the PCB 702. In the illustrated example, the upper shielding layers 720 include a first upper shielding layer 722 formed over the lead frame package 300, and a second upper shielding layer 724 formed over the first upper shielding layer 722. The respective upper shielding layers 722 and 724 may include shielding nanoparticles (e.g., magnetic shielding nanoparticles and/or radiation shielding nanoparticles) dispersed in or otherwise combined with a base compound, e.g., an epoxy or other polymer. Example magnetic shielding nanoparticles and example radiation shielding nanoparticles are listed above with reference to FIG. 1.

In some examples upper shielding layers 722 and 724 may include different types or different concentrations of shielding nanoparticles. For example, upper shielding layer 722 may comprise magnetic shielding nanoparticles (e.g., to shield die 102 from magnetic fields) and upper shielding layer 724 may comprise radiation shielding nanoparticles (e.g., to shield die 102 from ionic radiation), or vice versa. As another example, upper shielding layers 722 and 724 may comprise the same type of nanoparticles (e.g., magnetic shielding nanoparticles or radiation shielding nanoparticles) but with a respective different concentration of nanoparticles, to thereby define a shielding gradient along a direction toward, or away from, the die 102. For example, upper shielding layers 722 and 724 may provide an increasing degree of shielding in a direction toward the die 102 (e.g., wherein the upper shielding layer 722 provide a greater degree of shielding than the upper shielding layer 724).

Similarly, the lower shielding layers 732 and 734 may include shielding nanoparticles (e.g., magnetic shielding nanoparticles and/or radiation shielding nanoparticles) dispersed in or otherwise combined with a base compound, e.g., an epoxy or other polymer. Like the upper shielding layers 722 and 724, the lower shielding layers 732 and 734 may include different types or different concentrations of shielding nanoparticles, e.g., which may define a shielding gradient.

Figure 8:
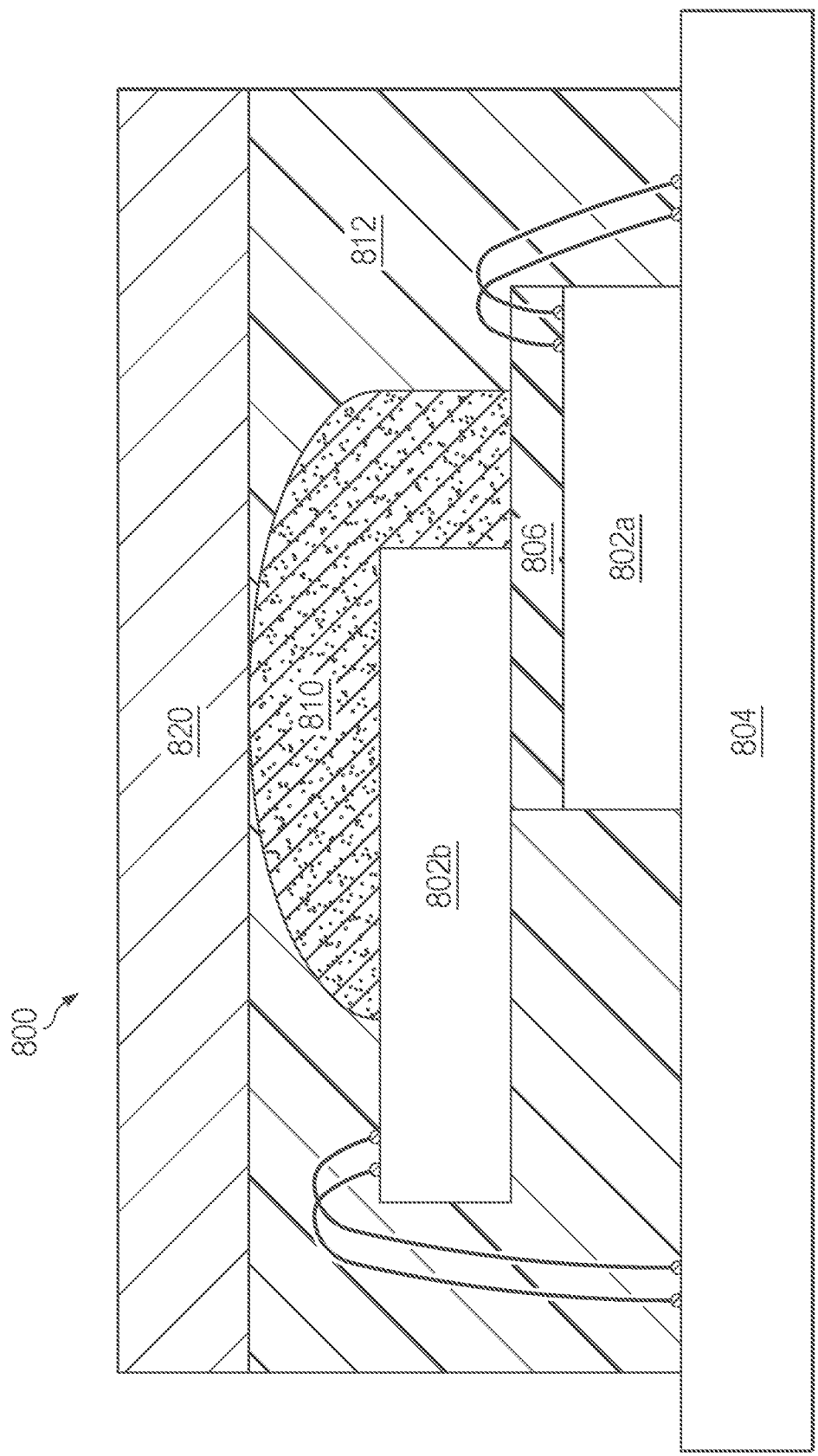
FIG. 8 is a cross-sectional side view of an example electronic device including two dies arranged on a PCB in a stacked manner, with a heat transfer chimney formed on the second die.

FIG. 8 is a cross-sectional side view showing an example electronic device 800 including a first (lower) die 802a and a second (upper) die 802b arranged on a PCB 804 in a stacked manner and separated from each other by an insulating layer 806, wherein the second (upper) die 802b generates more heat than the first (lower) die 802a. A heat transfer chimney 810 is formed over both dies 802a and 802b to remove heat generated by both dies 802a and 802b. As shown, the heat transfer chimney 810 may cover a larger area of the second die 802b than the first die 802a, in order to provide additional heat transfer from the hotter second die 802b. For example, (b) an area of contact between the heat transfer chimney 810 and the second die 802b and (b) an area of contact between the heat transfer chimney 810 and the first die 802a may be proportional to, or otherwise correspond with, a relationship between the heat generated by the second die 802b as compared with the first die 802a.

In some examples the heat transfer chimney 810 formed on dies 802a and 802b may comprise a single droplet or a few droplets of a thermally conductive compound 112, e.g., formed by a 2D, 2.5D, or 3D printer or nozzle-based injection molding, e.g., as discussed above. Forming a single heat transfer chimney on multiple dies may provide cost savings as compared with forming a distinct heat transfer chimney on the respective dies, and may allow for a more compact design, e.g., using a smaller footprint.

As shown in FIG. 8, a mold structure 812 may be formed over the first and second dies 802a and 802b. A heat sink 820 may be formed over the mold structure 812 and thermally coupled to the heat transfer chimney 810, to facilitate heat transfer away from the second die 802b.

Figure 9:
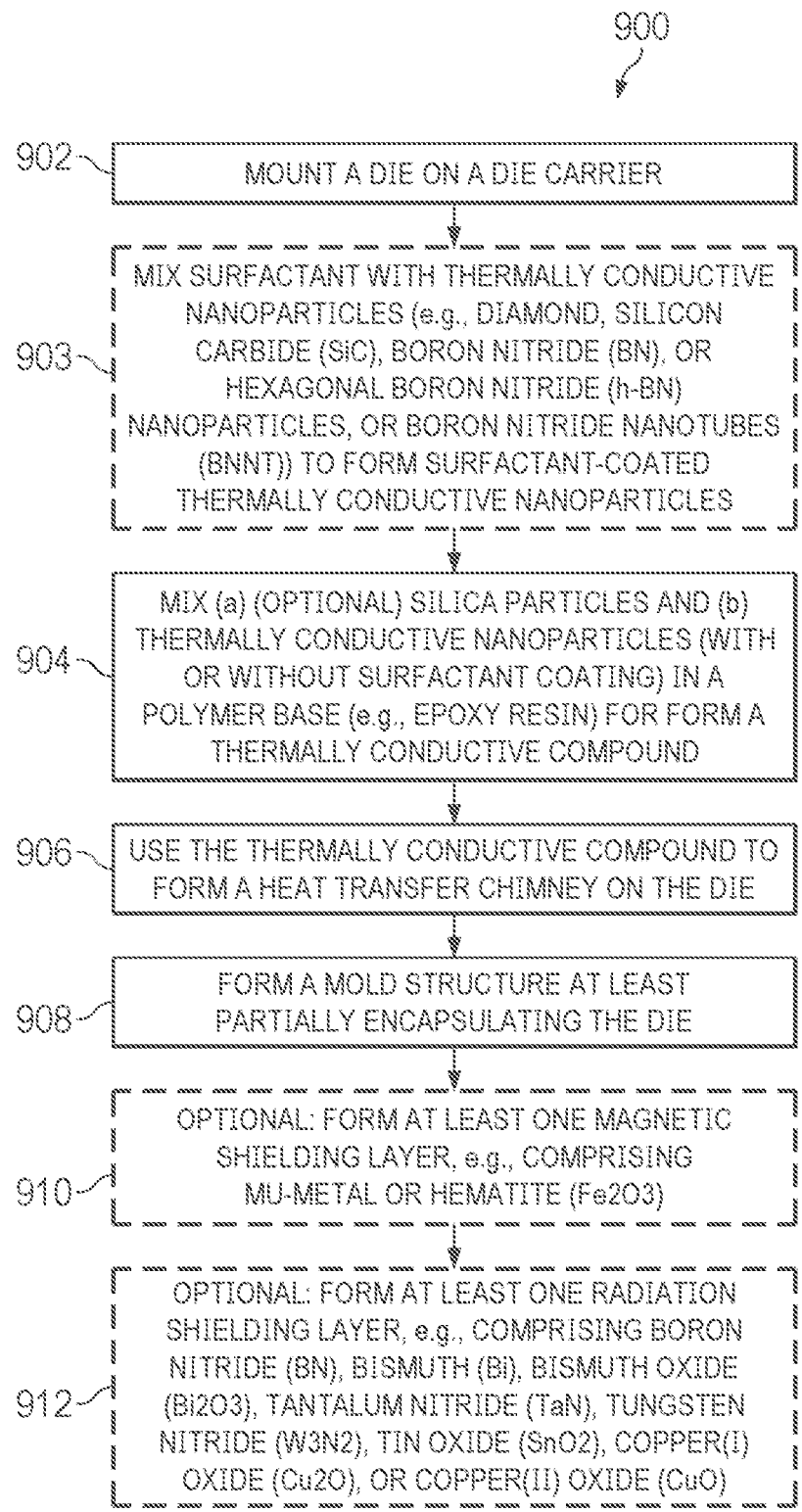
FIG. 9 is a flowchart showing an example method for forming an integrated circuit package including a heat transfer chimney including thermally conductive nanoparticles.

FIG. 9 is a flowchart showing an example method 900 for forming an integrated circuit package. At 902, a die is mounted on a die carrier. At 904, thermally conductive nanoparticles and (optionally) silica particles are mixed with a polymer base (e.g., epoxy resin) to form a thermally conductive compound. At 906, the thermally conductive compound is used to form a heat transfer chimney on the die, e.g., using a 2D, 2.5D, or 3D printer to print the heat transfer chimney. At 908, a mold structure if formed, which at least partially encapsulates the die. In some examples the mold structure may include shielding nanoparticles (e.g., magnetic shielding nanoparticles and/or radiation shielding nanoparticles), e.g., as discussed above.

Optionally, at 910 at least one magnetic shielding layer is formed, e.g., comprising mu-metal or hematite ($Fe_2O_3$). Optionally, at 912, at least one radiation shielding layer is formed, e.g., comprising boron nitride (BN), bismuth (Bi), bismuth oxide ($Bi_2O_3$), tantalum nitride (TaN), tungsten nitride ($W_3N_2$), tin oxide ($SnO_2$), copper (I) oxide ($Cu_2O$), or copper(II) oxide (CuO). The optional steps 910 and 912 may be performed in any order.

Figure 10:
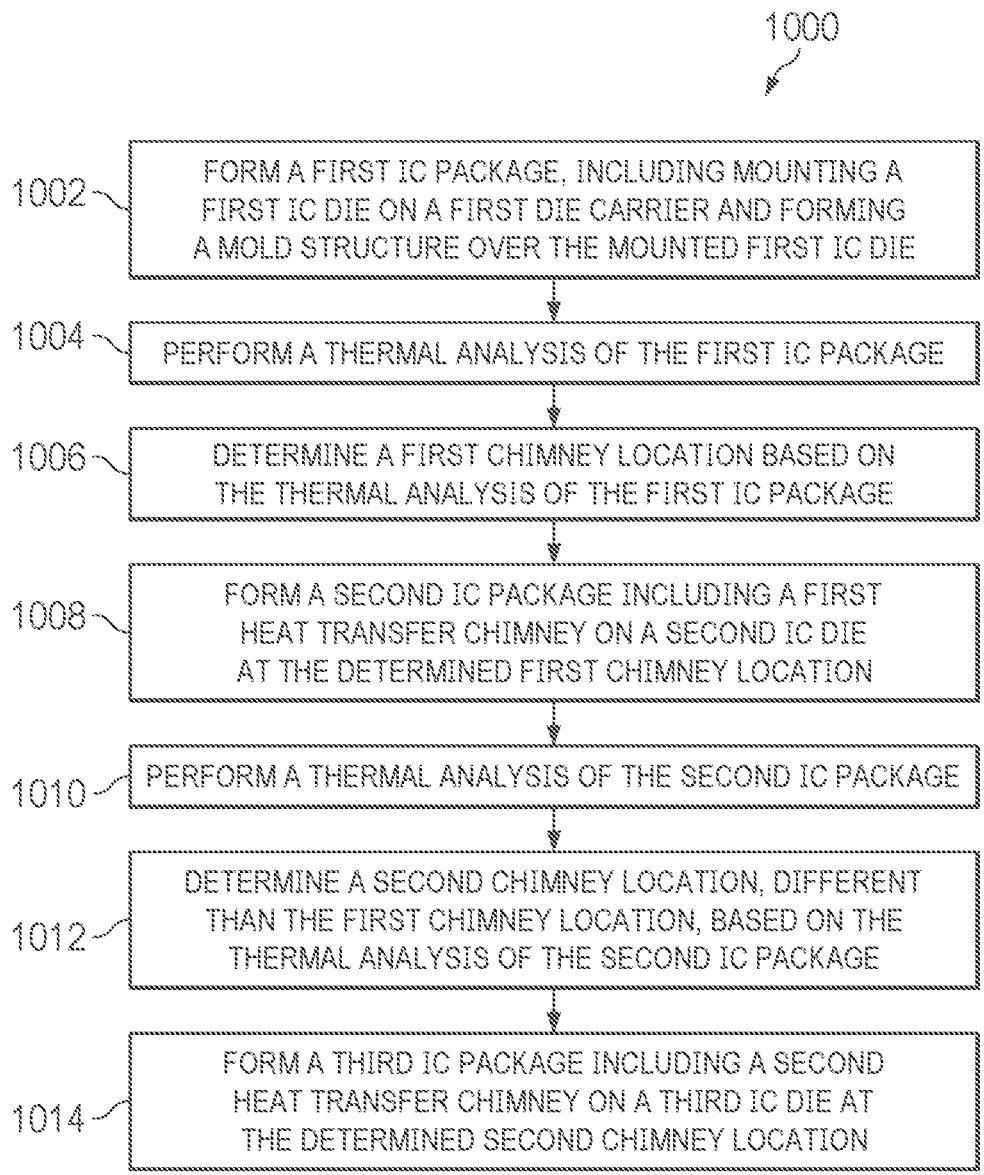
FIG. 10 is a flowchart showing an example method for analyzing and adjusting a location of a heat transfer chimney.

FIG. 10 is a flowchart showing an example method 1000 for analyzing and adjusting a location of a heat transfer chimney. At 1002 a first IC package including a first IC die mounted on a first die carrier, and a mold structure is formed over the mounted first IC die. A thermal analysis of the first IC package, in operation, is performed at 1004, e.g., performing a thermal scan of the first IC package using an infrared (IR) camera. At 1006, a first chimney location is determined based on the thermal analysis of the first IC package. For example, a thermal tensor flow module may analyze a thermal scan performed at 1004 and generate a thermal model to identify a first location for forming a heat transfer chimney. At 1008, a second IC package is formed, including a first heat transfer chimney on a second IC die (e.g., using an additive printing process) at the determined first chimney location. The second IC die is a second instance of the first IC die.

A thermal analysis of the second IC package is, in operation, performed at 1010, e.g., performing a thermal scan of the second IC package using an infrared (IR) camera. At 1012, a second chimney location (e.g., different than the first chimney location) is determined based on the thermal analysis of the second IC package, e.g., using a thermal tensor flow module to analyze a thermal scan performed at 1010 and generate a thermal model to identify a second location for forming a heat transfer chimney. At 1014, a third IC package is formed, including a second heat transfer chimney is formed on a third IC die (e.g., using an additive printing process) at the determined second chimney location. The third IC die is a third instance of the first IC die. This process may continue, e.g., in an iterative manner, to identify a target location of the heat transfer chimney for improved thermal performance.

The invention claimed is:

1. An electronic device, comprising:
   an integrated circuit package comprising:
      a die mounted on a die carrier;
      a mold structure at least partially encapsulating the mounted die; and
      a heat transfer chimney formed on the die and extending at least partially through the mold structure to transfer heat away from the die;
      wherein the heat transfer chimney is formed from a thermally conductive compound including thermally conductive nanoparticles dispersed in an epoxy or other polymer base.

2. The electronic device of claim 1, wherein the heat transfer chimney extends through a full thickness of the mold structure, wherein a distal surface of the heat transfer chimney is exposed through an outer surface of the mold structure.

3. The electronic device of claim 1, wherein the die carrier comprises a lead frame or an interposer.

4. The electronic device of claim 1, wherein the thermally conductive nanoparticles comprise at least one of diamond nanoparticles, silicon carbide nanoparticles, boron nitride nanoparticles, hexagonal boron nitride nanoparticles, or boron nitride nanotubes.

5. The electronic device of claim 1, wherein the thermally conductive compound including thermally conductive nanoparticles dispersed in a polymer resin.

6. The electronic device of claim 1, wherein the thermally conductive compound includes thermally conductive nanoparticles and silica dispersed in an epoxy resin.

7. The electronic device of claim 1, wherein the mold structure includes at least one of magnetic shielding nanoparticles to shield the die from magnetic fields or radiation shielding nanoparticles to shield the die from ionic radiation.

8. An electronic device, comprising:
   an integrated circuit package comprising:
      a die mounted on a die carrier;
      a mold structure at least partially encapsulating the mounted die; and
      a heat transfer chimney formed on the die and extending at least partially through the mold structure to transfer heat away from the die;
      wherein the heat transfer chimney is formed from a thermally conductive compound including thermally conductive nanoparticles; and
      wherein the mold structure includes shielding nanoparticles to protect the die, the shielding nanoparticles including at least one of (a) magnetic shielding nanoparticles to shield the die from magnetic fields or radiation shielding nanoparticles to shield the die from ionic radiation.

9. The electronic device of claim 8, wherein the mold structure includes magnetic shielding nanoparticles comprising at least one of mu-metal or hematite ($Fe_2O_3$).

10. The electronic device of claim 8, wherein the shielding nanoparticles comprise at least one of boron nitride (BN), bismuth (Bi), bismuth oxide ($Bi_2O_3$), tantalum nitride (TaN), tungsten nitride ($W_3N_2$), tin oxide ($SnO_2$), copper (I) oxide ($Cu_2O$), or copper (II) oxide (CuO).

11. The electronic device of claim 8, comprising a shielding layer formed over the mold structure, the shielding layer including at least one of (a) magnetic shielding nanoparticles to shield the die from magnetic fields or (b) radiation shielding nanoparticles to shield the die from ionizing radiation.

12. The electronic device of claim 8, comprising a multi-layer shield formed over the mold structure, wherein the multi-layer shield includes multiple different shielding layers, wherein respective shielding layers of the multiple different shielding layers include shielding nanoparticles to shield the die from at least one of magnetic fields or ionizing radiation, wherein the multiple different shielding layers include different types or different concentrations of shielding nanoparticles.

13. The electronic device of claim 12, wherein the different types or different concentrations of shielding nanoparticles in the multiple different shielding layers of the multi-layer shield defines a shielding gradient.

14. The electronic device of claim 8, wherein:
   the integrated circuit package is mounted on a first side of a package support structure; and
   the electronic device includes a back-side shielding layer formed on a second side of the package support structure opposite the first side, the back-side shielding layer including shielding nanoparticles to shield the die from at least one of magnetic fields or ionizing radiation.

15. A method, comprising:
   forming an integrated circuit package, including:
      mounting a die on a die carrier;
      forming a thermally conductive compound, including mixing thermally conductive nanoparticles with an epoxy or other polymer base;
      forming a heat transfer chimney on the die from the thermally conductive compound; and
      forming a mold structure at least partially encapsulating the die;
      wherein the heat transfer chimney extends at least partially through the mold structure; and wherein the heat transfer chimney includes thermally conductive nanoparticles to transfer heat away from the die.

16. The method of claim 15, wherein forming the thermally conductive compound includes mixing (a) silica particles and (b) the thermally conductive nanoparticles with a polymer.

17. The method of claim 15, wherein forming the thermally conductive compound includes:
mixing a surfactant with the thermally conductive nanoparticles to form surfactant-coated thermally conductive nanoparticles; and
mixing the surfactant-coated thermally conductive nanoparticles with a polymer.

18. The method of claim 15, wherein forming the thermally conductive compound includes:
mixing a surfactant with the thermally conductive nanoparticles to form surfactant-coated thermally conductive nanoparticles; and
mixing (a) the surfactant-coated thermally conductive nanoparticles and (b) silica filler with an epoxy.

19. The method of claim 15, wherein forming the thermally conductive compound includes mixing silica particles and thermally conductive nanoparticles with an epoxy resin, wherein the thermally conductive nanoparticles comprise diamond nanoparticles, silicon carbide nanoparticles, boron nitride nanoparticles, hexagonal boron nitride nanoparticles, or boron nitride nanotubes.

20. The method of claim 15, wherein forming the heat transfer chimney on the die comprises printing the heat transfer chimney using an additive printing process.

21. A method, comprising:
forming an integrated circuit package, including:
mounting a die on a die carrier;
forming a heat transfer chimney on the die;
mixing shielding nanoparticles with a mold compound to form a nanoparticle-enhanced mold compound; and
forming a mold structure at least partially encapsulating the die from the nanoparticle-enhanced mold compound
wherein the heat transfer chimney extends at least partially through the mold structure; and
wherein the heat transfer chimney includes thermally conductive nanoparticles to transfer heat away from the die.

22. The method of claim 21, comprising forming a shielding layer over the mold structure, the shielding layer including at least one of (a) magnetic shielding nanoparticles to shield the die from magnetic fields or (b) radiation shielding nanoparticles to shield the die from ionizing radiation.

23. The method of claim 21, comprising forming multiple different shielding layers over the mold structure, wherein respective shielding layers of the multiple different shielding layers include shielding nanoparticles to shield the die from at least one of magnetic fields or ionizing radiation, wherein the multiple different shielding layers include different types or different concentrations of shielding nanoparticles.

* * * * *